United States Patent
Ahn et al.

(10) Patent No.: US 8,738,987 B2
(45) Date of Patent: May 27, 2014

(54) MEMORY CONTROLLER AND MEMORY MANAGEMENT METHOD

(75) Inventors: Byoung-Young Ahn, Seongnam-si (KR); Hyun-Mo Chung, Seongnam-si (KR)

(73) Assignee: OCZ Storage Solutions, Inc., San Jose, CA (US)

( * ) Notice: Subject to any disclaimer, the term of this patent is extended or adjusted under 35 U.S.C. 154(b) by 253 days.

(21) Appl. No.: 13/142,605

(22) PCT Filed: Nov. 3, 2009

(86) PCT No.: PCT/KR2009/006426
§ 371 (c)(1),
(2), (4) Date: Jun. 29, 2011

(87) PCT Pub. No.: WO2010/076966
PCT Pub. Date: Jul. 8, 2010

(65) Prior Publication Data
US 2011/0271164 A1    Nov. 3, 2011

(30) Foreign Application Priority Data
Dec. 30, 2008 (KR) .......................... 10-2008-0136866

(51) Int. Cl.
*H03M 13/00* (2006.01)
*G11C 29/00* (2006.01)
(52) U.S. Cl.
USPC .......................................... 714/752; 714/764
(58) Field of Classification Search
USPC .................. 714/718, 752, 758, 764
See application file for complete search history.

(56) References Cited

U.S. PATENT DOCUMENTS

| 5,559,956 | A | | 9/1996 | Sukegawa | |
|---|---|---|---|---|---|
| 6,017,146 | A | * | 1/2000 | Masumoto et al. | 714/780 |
| 2002/0199151 | A1 | | 12/2002 | Zuraski et al. | |
| 2003/0088813 | A1 | | 5/2003 | McClellan et al. | |
| 2004/0156251 | A1 | | 8/2004 | Shiota et al. | |
| 2005/0172179 | A1 | | 8/2005 | Brandenberger et al. | |
| 2007/0255981 | A1 | * | 11/2007 | Eto | 714/710 |
| 2008/0072120 | A1 | | 3/2008 | Radke et al. | |
| 2008/0195900 | A1 | | 8/2008 | Chang et al. | |

FOREIGN PATENT DOCUMENTS

| EP | 1548602 | 6/2005 |
|---|---|---|
| JP | 2005-078431 | 3/2005 |
| JP | 2007-207376 | 8/2007 |

OTHER PUBLICATIONS

Chuan-Sheng Lin; Kuang-Yuan Chen; Yu-Hsian Wang; Lan-Rong Dung, "A NAND Flash Memory Controller for SD/MMC Flash Memory Card," Electronics, Circuits and Systems, 2006. ICECS '06. 13th IEEE International Conference on , vol., No., pp. 1284,1287, Dec. 10-13, 2006.*
Chuan-Sheng Lin; Lan-Rong Dung, "A NAND Flash Memory Controller for SD/MMC Flash Memory Card," Magnetics, IEEE Transactions on , vol. 43, No. 2, pp. 933,935, Feb. 2007.*
Supplementary European Search Report issued Jun. 5, 2012 in connection with European Patent Application No. 09836287.4.

* cited by examiner

*Primary Examiner* — Cynthia Britt
(74) *Attorney, Agent, or Firm* — Hartman Global IP Law; Gary M. Hartman; Michael D. Winter (57) ABSTRACT

Provided is a memory controller that generates Error Correction Code (ECC) information for data based on a required reliability level predetermined based on a type of the data, that computes an ECC code for the data based on the ECC information, and that records the ECC code in a memory based on the ECC information.

18 Claims, 5 Drawing Sheets

MEMORY CONTROLLER AND MEMORY MANAGEMENT METHOD

CROSS-REFERENCE TO RELATED APPLICATIONS

This application is the National Stage of International Application No. PCT/KR2009/006426, filed on Nov. 3, 2009, which claims the priority of Korean Patent Application No. 10-2008-0136866, filed on Dec. 30, 2008. The contents of all applications are hereby incorporated by reference in their entirety.

TECHNICAL FIELD

Embodiments of the present invention relate to a memory controller and a memory management method. More particularly, embodiments of the present invention relate to a memory controller and a memory management method that may efficiently manage a memory by using various Error Correction Code (ECC) schemes based on a type of data to be recorded in the memory.

BACKGROUND ART

A storage device for storing data may include, for example, a magnetic disk, a semiconductor memory, and the like. Since physical characteristics are different for each type of storage device, a management method corresponding to the physical characteristics is required.

Conventionally, magnetic disks are widely used as a storage device. A read/write time of the magnetic disk takes an average of several milliseconds per kilobyte. Additionally, since an arrival time of an arm of the magnetic disk is different depending on a physical location where data is stored, the read/write time of the magnetic disk varies.

Recently, a non-volatile memory that takes a relatively short read/write time, consumes a small amount of power, and occupies a small amount of space, compared with a magnetic disk, is being rapidly replaced by the magnetic disk. This is because a capacity of the non-volatile memory becomes larger.

The non-volatile memory may perform electrically reading, writing, and erasing. The non-volatile memory is a semiconductor memory device that is able to maintain stored data even when power is cut off. A process of storing data in a non-volatile memory device is referred to as programming, in addition to writing.

A typical example of the non-volatile memory includes a flash memory. The flash memory has advantages of a small size, a low power consumption, and a high read speed, compared with a conventional Hard Disk Drive (HDD). Recently, a Solid State Disk (SSD) was proposed to replace an HDD using a high-capacity flash memory.

The flash memory may typically include, for example, a NAND-type flash memory, a NOR-type flash memory, and the like. A NAND scheme and a NOR scheme may be distinguished based on a configuration and operation scheme of a cell array.

A flash memory includes an array of a plurality of memory cells, and a single memory cell may store at least one data bit. A single memory cell includes a control gate and a floating gate, and an insulator is inserted between the control gate and the floating gate. An insulator is also inserted between the floating gate and a substrate.

The non-volatile memory is managed by a predetermined controller. Additionally, an overall performance of the non-volatile memory may be determined based on a performance of the controller.

Accordingly, there is a desire for a research on a memory controller that may efficiently manage and control a memory.

DETAILED DESCRIPTION OF THE INVENTION

Technical Goals

An aspect of the present invention is to provide a memory controller and a memory management method that may efficiently manage a memory by using various Error Correction Code (ECC) schemes based on a reliability required according to a type of data to be recorded in the memory.

Technical Solutions

According to an aspect of the present invention, there is provided a memory controller including an Error Correction Code (ECC) generation unit to generate ECC information for data based on a required reliability level, the required reliance level being predetermined based on a type of the data, an ECC operation unit to compute an ECC code for the data based on the ECC information, and an ECC record unit to record the ECC code in a memory based on the ECC information.

According to another aspect of the present invention, there is provided a memory management method including generating ECC information for data based on a required reliability level, the required reliance level being predetermined based on a type of the data, computing an ECC code for the data based on the ECC information, and recording the ECC code in a memory based on the ECC information.

Effect of the Invention

According to embodiments of the present invention, provided are a memory controller and a memory management method that may use various Error Correction Code (ECC) schemes based on a reliability required according to a type of data to be recorded in a memory, and thus it is possible to efficiently manage the memory.

BEST MODE FOR CARRYING OUT THE INVENTION

Hereinafter, exemplary embodiments of the present invention will be described in detail with reference to the accompanying drawings.

Figure 1:
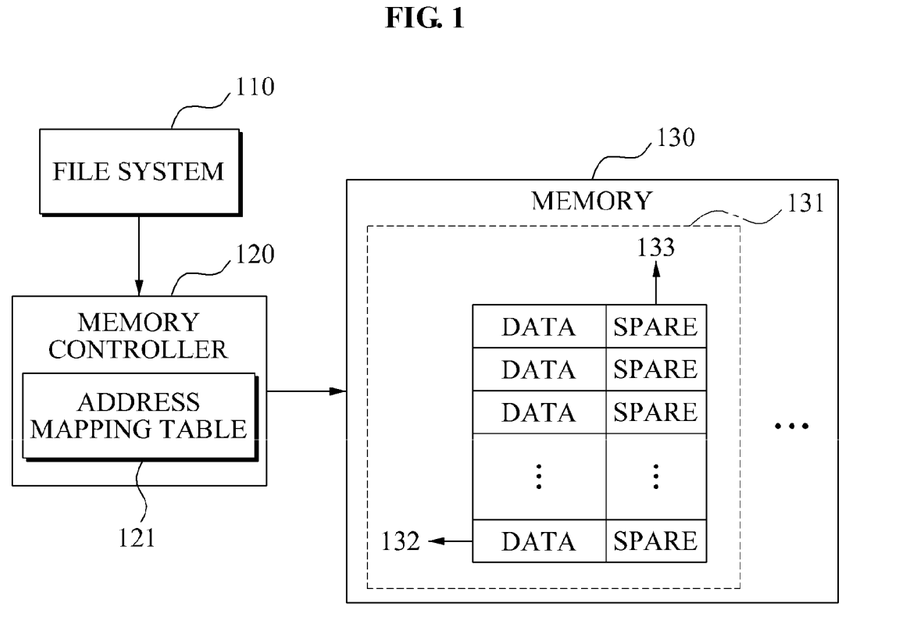
FIG. 1 is a concept diagram illustrating an operation of a memory controller according to an embodiment of the present invention.

FIG. 1 is a concept diagram illustrating an operation of a memory controller according to an embodiment of the present invention.

Referring to FIG. 1, a file system 110, a memory controller 120, and a memory 130 are illustrated.

According to an embodiment of the present invention, the memory 130 may be a non-volatile memory.

Generally, programming with respect to the non-volatile memory 130 may be performed in page units, and erasing may be performed in block units. Here, a block may include a plurality of pages.

Additionally, the memory controller 120 for managing the non-volatile memory 130 may provide a logical address to an external host or a processor, and may provide a physical address with respect to the non-volatile memory 130.

The memory controller 120 may manage the non-volatile memory 130 using the physical address, and may convert the physical address to the logical address.

Here, a layer in which converting of the physical address and the logical address is performed is referred to as a Flash Translation Layer (FTL).

The memory controller 120 may use an Error Correction Code (ECC) to guarantee reliability of data recorded in the memory 130.

In general, ECC information may be used to detect whether an error exists, for example, whether data different from data recorded in the memory 130 is read during reading of the data recorded in the memory 130, and used to correct erroneous data to correct data.

The ECC information may be recorded on a specific portion of the memory 130, and may typically be recorded on a spare portion of the memory 130, and the like.

The memory controller 120 according to an embodiment of the present invention may guarantee the reliability of the data recorded in the memory 130, by using the ECC information.

Generally, to guarantee data reliability using ECC information, there is a need to consider various elements, for example an ECC algorithm, an application target of an ECC, a size of an ECC code or a record location of an ECC, and the like.

To guarantee reliability of data using ECC information, a conventional memory controller specifies the elements based on a mapping algorithm of a memory controller, a use, a characteristic of a memory, and the like, and uniformly applies the elements to data to be recorded in the memory.

In other words, the conventional memory controller specifies, in a single one, the above-described elements, such as the ECC algorithm, the application target of the ECC, the size of the ECC code, the record location of the ECC, and the like, regardless of a type of data to be recorded in a memory, and applies the single one to the memory.

However, such a conventional scheme may be inefficient in terms of memory management, because a type or characteristic of data was not taken into consideration.

For example, in a case in which an ECC scheme that uses small space of a memory and enables quick operation, but that does not significantly guarantee a reliability of data to be recorded in the memory is used uniformly regardless of the type of the data to be recorded in the memory, a reliability corresponding to data requiring high reliability, such as metadata, may not be guaranteed.

Conversely, in a case in which an ECC scheme that may guarantee a high reliability of data to be recorded in a memory, but that uses large space of the memory and takes a long operation time is used uniformly regardless of the type of the data to be recorded in the memory, when data having no relevance to guarantee of a relatively low reliability, such as user data, is recorded in the memory, large memory space and time may be wasted.

Accordingly, the memory controller 120 according to an embodiment of the present invention may enable efficient management of the memory 130 by dynamically applying an ECC scheme based on the type of data to be recorded in the memory 130.

In addition, when a write request for predetermined data is received from the file system 110, the memory controller 120 may generate ECC information for the data, based on a required reliability level predetermined based on the type of the data.

Subsequently, the memory controller 120 may compute an ECC code for the data, based on the ECC information, and may then record the ECC code in the memory 130.

According to an embodiment of the present invention, the file system 110 may transmit required reliability level information associated with the data, while transmitting the write request for the data to the memory controller 120.

Additionally, according to an embodiment of the present invention, the ECC information may include information regarding the ECC algorithm, the size of the ECC code, the application target of the ECC or the record location of the ECC, and the like.

In other words, the memory controller 120 according to an embodiment of the present invention may determine the ECC algorithm, the size of the ECC code, the application target of the ECC or the record location of the ECC and the like, based on the required reliability level predetermined based on the type of the data.

Additionally, according to an embodiment of the present invention, the required reliability level may be predetermined based on the type of the data, and may then be recorded in an address mapping table 121.

Here, according to an embodiment of the present invention, the memory controller 120 may determine the required reliability level based on the address mapping table 121.

For example, by adding a field for classifying the required reliability level to the address mapping table 121, the memory controller 120 may recognize a required reliability level based on the type of the data, and may generate suitable ECC information accordingly.

Here, the address mapping table 121 refers to a table in which a logical address and a physical address are mapped to each other.

Additionally, according to an embodiment of the present invention, when a read request for the data is received from the file system 110, the memory controller 120 may read the data from the memory 130, while reading the ECC code recorded in the memory 130 based on the ECC information.

Here, according to an embodiment of the present invention, the memory controller 120 may determine a required reliability level predetermined for the data, based on the address mapping table, and may read the ECC code based on the required reliability level.

Additionally, the memory controller 120 may compute a second ECC code for the read data, based on the ECC information.

Subsequently, the memory controller 120 may compare the read ECC code with the second ECC code, based on the ECC information, may detect whether an error occurs in the read data, and may correct the error when the error is detected.

Hereinafter, an example of an operation of the memory controller 120 will be further described.

First, it is assumed that a request to write first data and second data is received from the file system 110 to the memory controller 120.

Additionally, it is assumed that a required reliability level of the first data is a first required reliability level, that a required reliability level of the second data is a second required reliability level, and that the first required reliability level exceeds the second required reliability level.

Reference numeral 131 of FIG. 1 represents a page of the memory 130. A page 131 may include a plurality of sectors, and each of the sectors may be classified into a data portion and a spare portion.

According to an embodiment of the present invention, the memory controller 120 may compute a first ECC code for the first data, based on an entire page where the first data is to be recorded.

Subsequently, the memory controller 120 may record the first ECC code in a last sector of the page.

Referring to reference numeral 131, the memory controller 120 may compute the first ECC code based on the entire page 131 where the first data is to be recorded, and may then record the first ECC code in a last sector 132 of the page 131.

Additionally, according to an embodiment of the present invention, the memory controller 120 may compute a second ECC code for the second data, for each sector where the second data is to be recorded.

Subsequently, the memory controller 120 may recode the second ECC code in a spare portion of the memory 130.

In addition, referring to reference numeral 131, the memory controller 120 may compute the second ECC code, for each of the sectors of the page 131 where the second data is to be recorded, and may then record the second ECC code in a spare portion 133.

In other words, when data requiring a relatively high reliability level is recorded in the memory 130, the memory controller 120 according to an embodiment of the present invention may compute an ECC code for the data based on an entire single page, and may then record the ECC code in a last sector of the page, so that a high reliability of the data may be guaranteed despite an increase in space usage of the memory 130.

Additionally, when data requiring a relatively low reliability level is recorded in the memory 130, the memory controller 120 according to an embodiment of the present invention may compute an ECC code for the data for each sector, and may then record the ECC code in a spare portion of the memory 130, so that it is possible to enable a gain to be obtained in terms of a space usage and speed of the memory 130, despite a slight reduction in reliability level guaranteed for the data.

The operation of the memory controller 120 performed when data is recorded in the memory 130 has been described above. Hereinafter, an operation of the memory controller 120 performed when the data is read from the memory 130 will be described.

First, a case in which the memory controller 120 reads, from the memory 130, the first data recorded by the above-described scheme will be described.

When a read request for the first data is received from the file system 110, the memory controller 120 may read the first ECC code from the last sector 132 of the page 131 where the first data is recorded.

Subsequently, the memory controller 120 may compute a third ECC code for the read first data, based on the entire page 131, may compare the first ECC code with the third ECC code, may detect whether an error occurs in the read first data, and may correct the error.

Secondly, a case in which the memory controller 120 reads, from the memory 130, the second data recorded by the above-described scheme will be described.

When a read request for the second data is received from the file system 110, the memory controller 120 may read the second ECC code from the spare portion 133 of the memory 130.

Subsequently, the memory controller 120 may compute a fourth ECC code for the read second data, for each of the sectors, may compare the second ECC code with the fourth ECC code, may detect whether an error occurs in the read second data, and may correct the error.

In general, in a case in which data to be recorded in the memory 130 is metadata of the memory controller 120, when information thereof is lost, a higher reliability than user data needs to be guaranteed, since all data recorded in the memory 130 is not reliable.

Accordingly, according to an embodiment of the present invention, when data to be recorded in the memory 130 is metadata of the memory controller 120, a required reliability level of the metadata may be set to be higher than a required reliability level of user data.

In this case, since the memory controller 120 is generally able to distinguish the metadata and the user data, it is advantageous that there is no need to consider a separate method for classifying a required reliability level predetermined based on a type of data.

In addition, according to an embodiment of the present invention, the memory controller 120 may be designed so that the metadata may be recorded in only a specific location of the memory 130. Accordingly, an operation of adding a specific field to the address mapping table 121 to classify a required reliability level predetermined based on a type of data may be omitted.

Hereinafter, a process in which the memory controller 120 is operated depending on whether data to be recorded in the memory 130 is metadata or user data will be further described with reference to FIG. 2.

Figure 2:
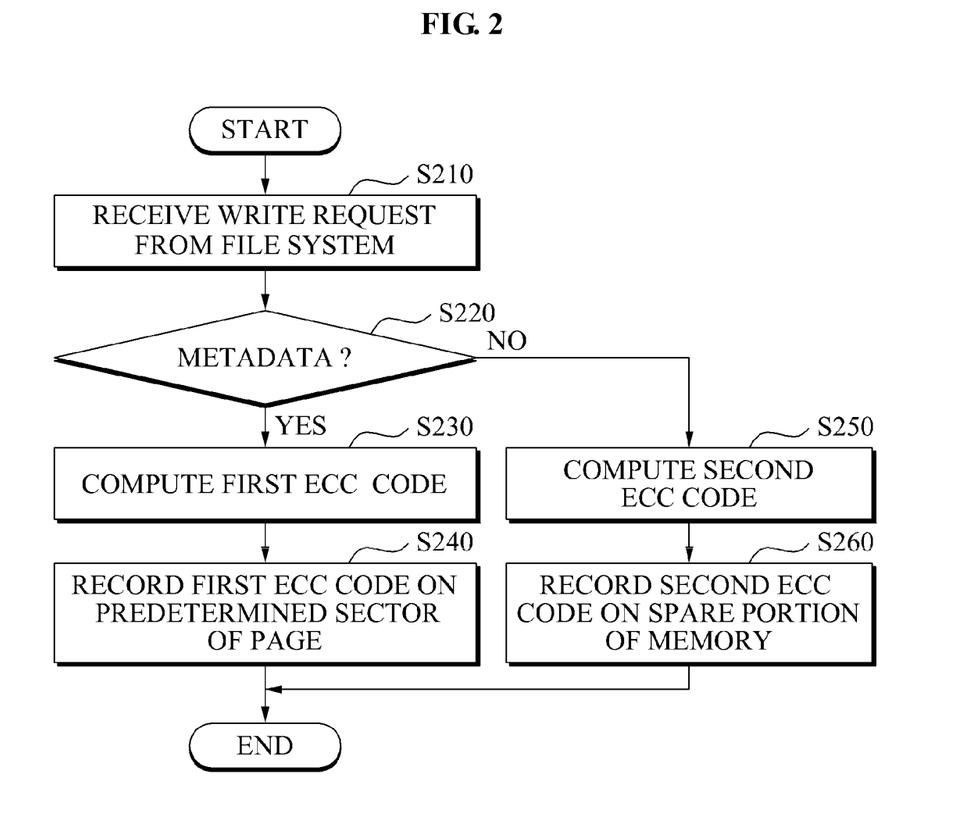
FIG. 2 is a flowchart illustrating an operation process of a memory controller according to an embodiment of the present invention.

FIG. 2 is a flowchart illustrating an operation process of a memory controller according to an embodiment of the present invention.

In operation S210, the memory controller 120 receives a data write request from the file system 110.

In operation S220, the memory controller 120 determines whether data requested to be written from the file system 110 is metadata of the memory controller 120.

For example, when the data requested to be written from the file system 110 is determined to be the metadata of the memory controller 120 in operation S220, the memory controller 120 may compute a first ECC code for the metadata, based on an entire page where the metadata is to be recorded in operation S230.

Subsequently, in operation S240, the memory controller 120 records the first ECC code on a predetermined sector of the page.

According to an embodiment of the present invention, the predetermined sector may be a last sector of the page.

However, when the data is determined to be user data, not the metadata in operation S220, the memory controller 120 may compute a second ECC code for the user data, for each sector where the user data is to be recorded in operation S250.

Subsequently, in operation S260, the memory controller 120 records the second ECC code on a spare portion of the memory 130.

As a result, when metadata requiring a relatively high reliability level is recorded in the memory 130, the memory controller 120 according to an embodiment of the present invention may compute an ECC code for the metadata based on an entire single page, and may then record the ECC code in a last sector of the page, so that a high reliability of the metadata may be guaranteed despite an increase in space usage of the memory 130.

Additionally, when user data requiring a relatively low reliability level is recorded in the memory 130, the memory controller 120 according to an embodiment of the present invention may compute an ECC code for the user data, for each sector, and may then record the ECC code in a spare portion of the memory 130, so that it is possible to enable a gain to be obtained in terms of a space usage and speed of the memory 130, despite a slight reduction in reliability level guaranteed for the user data.

The operation of the memory controller 120 performed when data is recorded in the memory 130 has been described above. Hereinafter, an operation of the memory controller 120 performed when the data is read from the memory 130 will be described with reference to FIG. 3.

Figure 3:
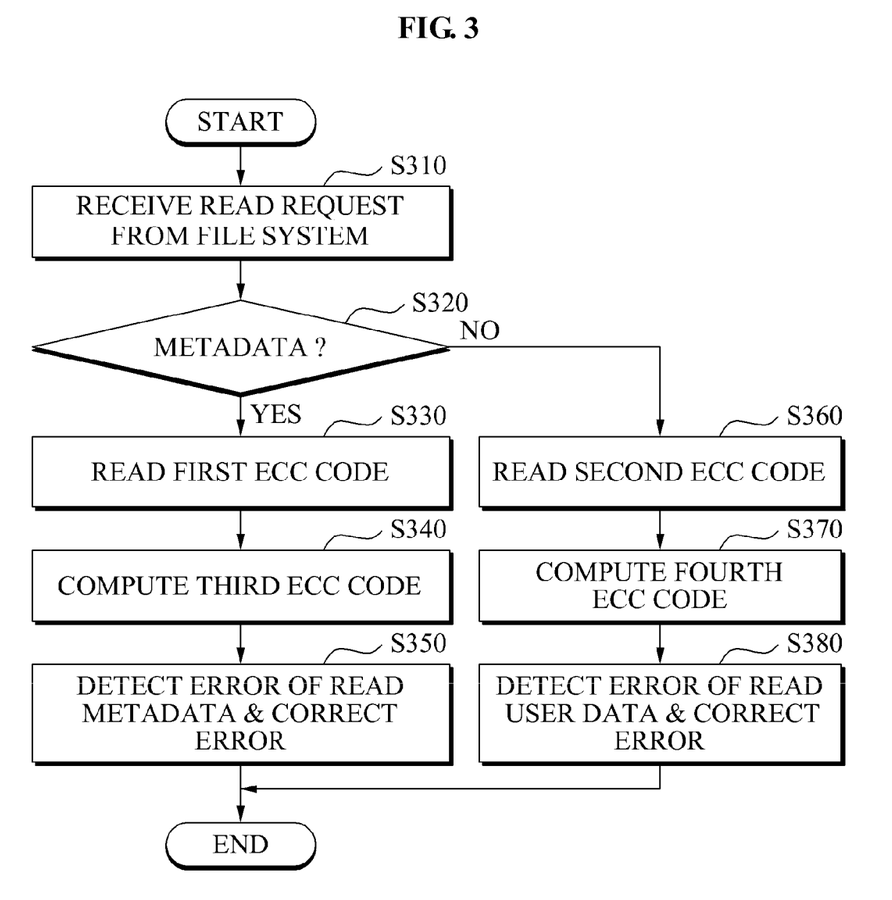
FIG. 3 is a flowchart illustrating an operation process of a memory controller according to another embodiment of the present invention.

FIG. 3 is a flowchart illustrating an operation process of a memory controller according to another embodiment of the present invention.

In operation S310, the memory controller 120 receives a data read request from the file system 110.

In operation S320, the memory controller 120 determines whether data requested to be read from the file system 110 is metadata of the memory controller 120.

For example, when the data requested to be read from the file system 110 is determined to be the metadata of the memory controller 120 in operation S320, the memory controller 120 may read the first ECC code from the last sector of the page where the metadata is recorded in operation S330.

Subsequently, in operation S340, the memory controller 120 computes a third ECC code for the metadata read from the memory 130, based on the entire page.

In operation S350, the read first ECC code and the third ECC code are compared, and an error of the read metadata is detected and corrected.

For example, when the data is determined to be user data, not the metadata in operation S320, the memory controller 120 may read the second ECC code from the spare portion of the memory 130 in operation S360.

Subsequently, in operation S370, the memory controller 120 computes a fourth ECC code for the user data read from the memory 130, for each of the sectors.

In operation S380, the read second ECC code and the fourth ECC code are compared, and an error of the user data is detected and corrected.

Figure 4:
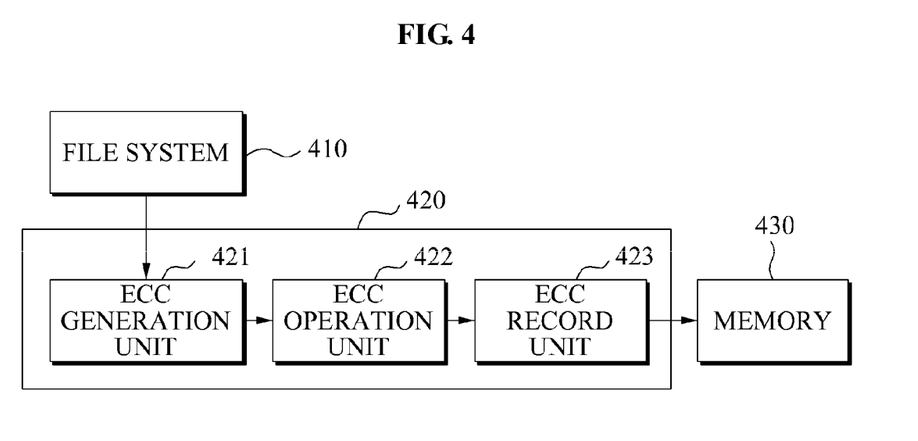
FIG. 4 is a diagram illustrating a structure of a memory controller according to an embodiment of the present invention.

FIG. 4 is a diagram illustrating a structure of a memory controller according to an embodiment of the present invention.

Referring to FIG. 4, a file system 410, a memory controller 420, and a memory 430 are illustrated.

The memory controller 420 may include an ECC generation unit 421, an ECC operation unit 422, and an ECC record unit 423.

When the file system 410 requests writing of data, the ECC generation unit 421 may generate ECC information for the data, based on a required reliability level predetermined based on a type of the data.

According to an embodiment of the present invention, the required reliability level may be predetermined based on the type of the data, and may then be recorded on an address mapping table.

Here, according to an embodiment of the present invention, the ECC generation unit 421 may determine the required reliability level based on the address mapping table, and may generate the ECC information.

The ECC operation unit 422 may compute an ECC code for the data based on the ECC information.

The ECC record unit 423 may record the ECC code in the memory 430 based on the ECC information.

According to an embodiment of the present invention, the memory controller 420 may further include an ECC read unit (not illustrated), a second ECC operation unit (not illustrated), and an error detection unit (not illustrated).

The ECC read unit may read the ECC code from the memory 430 based on the ECC information, when the data is read from the memory 430 in response to a data read request received form the file system 410.

The second ECC operation unit may compute a second ECC code for the read data, based on the ECC information.

The error detection unit may compare the read ECC code with the second ECC code, based on the ECC information, may detect whether an error occurs in the read data, and may correct the error when the error is detected.

According to an embodiment of the present invention, when a required reliability level of the data is a first required reliability level, the ECC operation unit 422 may compute a first ECC code for the data based on an entire page where data is to be recorded. When the required reliability level of the data is a second required reliability level, the ECC operation unit 422 may compute a second ECC code for the data for each sector where the data is to be recorded.

Here, the first required reliability level may exceed the second required reliability level.

According to an embodiment of the present invention, the ECC record unit 423 may record the first ECC code on a predetermined sector of the page, and may record the second ECC code on a spare portion of the memory 430.

Here, according to an embodiment of the present invention, the predetermined sector may be a last sector of the page.

Additionally, according to an embodiment of the present invention, when the memory controller 420 reads, from the memory 430, the data predetermined as the first required reliability level, the ECC read unit may read the first ECC code from the predetermined sector of the page.

Furthermore, the second ECC operation unit may compute a third ECC code for the read data, based on the entire page.

Subsequently, the error detection unit may compare the read first ECC code with the third ECC code, may detect whether an error occurs in the read data, and may correct the error when the error is detected.

Additionally, according to an embodiment of the present invention, when the memory controller 420 reads, from the memory 430, the data predetermined as the second required reliability level, the ECC read unit may read the second ECC code from the spare portion of the memory 430.

Furthermore, the second ECC operation unit may compute a fourth ECC code for the read data, for each sector.

Subsequently, the error detection unit may compare the read second ECC code with the fourth ECC code, may detect whether an error occurs in the read data, and may correct the error when the error is detected.

In addition, according to an embodiment of the present invention, when the data is metadata, a required reliability level of the metadata may be predetermined as the first required reliability level. When the data is user data, a required reliability level of the user data may be predetermined as the second required reliability level.

Moreover, according to an embodiment of the present invention, when the data is metadata, the ECC operation unit 422 may compute a first ECC code for the metadata based on an entire page where the metadata is to be recorded. When the data is user data, the ECC operation unit 422 may compute a second ECC code for the user data, for each sector where the user data is to be recorded.

Here, according to an embodiment of the present invention, the ECC record unit 423 may record the first ECC code on a predetermined sector of the page, and may record the second ECC code on a spare portion of the memory.

Here, according to an embodiment of the present invention, the predetermined sector may be a last sector of the page.

Additionally, according to an embodiment of the present invention, when the memory controller 420 reads the metadata from the memory 430, the ECC read unit may read the first ECC code from the predetermined sector of the page.

Furthermore, the second ECC operation unit may compute a third ECC code for the read metadata, based on the entire page.

Subsequently, the error detection unit may compare the read first ECC code with the third ECC code, may detect whether an error occurs in the read metadata, and may correct the error when the error is detected.

Additionally, according to an embodiment of the present invention, when the memory controller 420 reads the user data from the memory 430, the ECC read unit may read the second ECC code from the spare portion of the memory 430.

Furthermore, the second ECC operation unit may compute a fourth ECC code for the read user data, for each sector.

Subsequently, the error detection unit may compare the read second ECC code with the fourth ECC code, may detect whether an error occurs in the read user data, and may correct the error when the error is detected.

Figure 5:
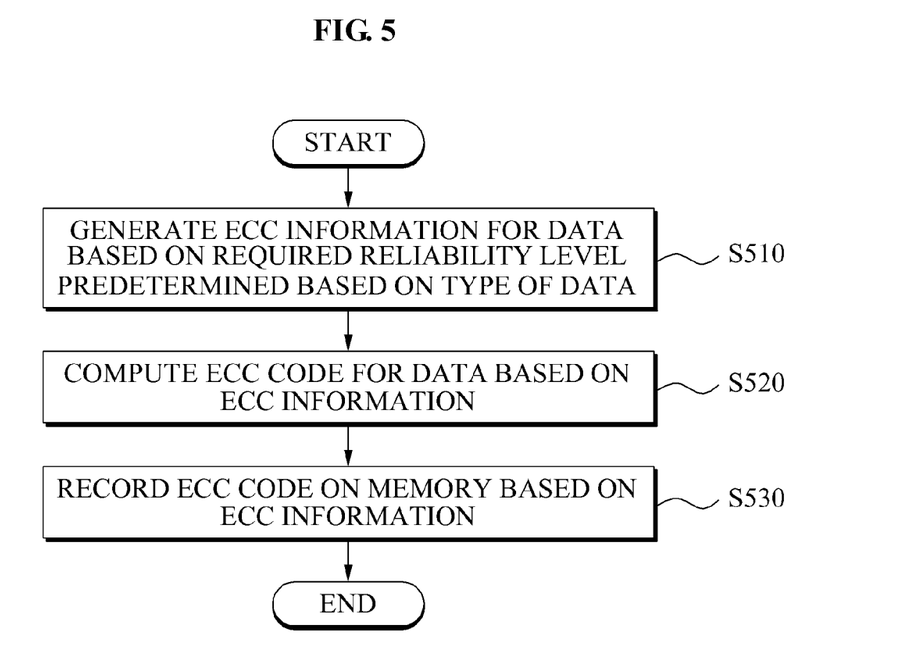
FIG. 5 is a flowchart illustrating a memory management method according to an embodiment of the present invention.

FIG. 5 is a flowchart illustrating a memory management method according to an embodiment of the present invention.

In operation S510, when a file system requests writing of data, ECC information for the data is generated based on a required reliability level predetermined based on a type of the data.

According to an embodiment of the present invention, the required reliability level may be predetermined based on the type of the data, and may then be recorded on an address mapping table.

Here, according to an embodiment of the present invention, in operation S510, the required reliability level may be determined based on the address mapping table, and the ECC information may be generated.

In operation S520, an ECC code for the data is computed based on the ECC information generated in operation S510.

In operation S530, the ECC code computed in operation S520 is recorded in a memory based on the ECC information.

According to an embodiment of the present invention, the memory management method according to the present invention may further include, after operation S530, reading the ECC code from the memory based on the ECC information, when the data is read from the memory in response to a data read request received from the file system.

Here, the memory management method according to an embodiment of the present invention may further include computing a second ECC code for the read data based on the ECC information.

Subsequently, the memory management method according to an embodiment of the present invention may further include comparing the read ECC code with the second ECC code based on the ECC information, detecting whether an error occurs in the read data, and correcting the error when the error is detected.

According to an embodiment of the present invention, when the data is metadata, a required reliability level of the metadata may be predetermined as a first required reliability level. When the data is user data, a required reliability level of the user data may be predetermined as a second required reliability level.

Here, the first required reliability level may exceed the second required reliability level.

Additionally, according to an embodiment of the present invention, in operation S520, when the data is metadata, a first ECC code for the metadata may be computed based on an entire page where the metadata is to be recorded. In addition, when the data is user data, a second ECC code for the user data may be computed for each sector where the user data is to be recorded.

Here, according to an embodiment of the present invention, in operation S530, the first ECC code may be recorded on a predetermined sector of the page, and the second ECC code may be recorded on a spare portion of the memory.

Here, according to an embodiment of the present invention, the predetermined sector may be a last sector of the page.

Here, the memory management method according to an embodiment of the present invention may further include, after operation S530, reading the first ECC code from a predetermined sector of the page when the metadata is read from the memory.

Here, the memory management method according to an embodiment of the present invention may further include computing a third ECC code for the read metadata, based on the entire page.

Subsequently, the memory management method according to an embodiment of the present invention may further include comparing the read first ECC code with the third ECC code, detecting whether an error occurs in the read metadata, and correcting the error when the error is detected.

Additionally, the memory management method according to an embodiment of the present invention may further include, after operation S530, reading the second ECC code from the spare portion of the memory when the user data is read from the memory.

Here, the memory management method according to an embodiment of the present invention may further include computing a fourth ECC code for the read user data, for each sector.

Subsequently, the memory management method according to an embodiment of the present invention may further include comparing the read second ECC code with the fourth ECC code, detecting whether an error occurs in the read user data, and correcting the error when the error is detected.

The memory management method according to an embodiment of the present invention has been described above with reference to FIG. 5. Here, the memory management method according to an embodiment of the present invention may correspond to a configuration of the memory controller described based on FIGS. 1 through 4 and accordingly, a further description thereof will be omitted.

The memory management method according to embodiments of the present invention may be recorded in computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts. Examples of computer-readable media include magnetic media such as hard disks, floppy disks, and magnetic tape; optical media such as CD ROM disks and DVDs; magnetooptical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

The invention claimed is:

1. A memory controller for managing a nonvolatile memory device comprising pages that are organized into memory blocks, comprising:
   an Error Correction Code (ECC) generation unit to generate ECC information for data based on a required reliability level, the required reliability level being predetermined based on a type of the data;
   an ECC operation unit to compute an ECC code for the data based on the ECC information; and
   an ECC record unit to record the ECC code in a page of the nonvolatile memory device based on the ECC information,
   wherein the page is configured to store the data and the ECC code independent of the required reliability level of the data.

2. The memory controller of claim 1, wherein the required reliability level is predetermined based on the type of the data, and then is recorded in an address mapping table, and
   wherein the ECC generation unit determines the required reliability level based on the address mapping table, and generates the ECC information.

3. The memory controller of claim 1, further comprising:
   an ECC read unit to read the ECC code from the memory based on the ECC information, when the data is read from the memory;
   a second ECC operation unit to compute a second ECC code for the read data based on the ECC information; and
   an error detection unit to compare the read ECC code with the second ECC code, based on the ECC information, to detect whether an error occurs in the read data, and to correct the error when the error is detected.

4. The memory controller of claim 1, wherein, when a required reliability level of the data is a first required reliability level, the ECC operation unit computes a first ECC code for the data based on an entirety of the page where the data is to be recorded,
   wherein, when the required reliability level of the data is a second required reliability level, the ECC operation unit computes a second ECC code for the data for each sector of the page where the data is to be recorded, and
   wherein the first required reliability level exceeds the second required reliability level.

5. The memory controller of claim 4, wherein the ECC record unit records the first ECC code on a predetermined sector of the page, and records the second ECC code on a spare portion of the memory.

6. The memory controller of claim 1, wherein, when the data is metadata, a required reliability level of the metadata is predetermined as a first required reliability level,
   wherein, when the data is user data, a required reliability level of the user data is predetermined as a second required reliability level, and
   wherein the first required reliability level exceeds the second required reliability level.

7. The memory controller of claim 1, wherein, when the data is metadata, the ECC operation unit computes a first ECC code for the metadata based on an entirety of the page where the metadata is to be recorded, and
   wherein, when the data is user data, the ECC operation unit computes a second ECC code for the user data for each sector of the page where the user data is to be recorded.

8. The memory controller of claim 7, wherein the ECC record unit records the first ECC code on a predetermined sector of the page, and records the second ECC code on a spare portion of the memory.

9. A memory management method for managing a nonvolatile memory device comprising pages that are organized into memory blocks, comprising:
   generating Error Correction Code (ECC) information for data based on a required reliability level, the required reliability level being predetermined based on a type of the data;
   computing an ECC code for the data based on the ECC information; and
   recording the ECC code in a page of the nonvolatile memory device based on the ECC information,
   wherein the page of the nonvolatile memory device where the ECC code is recorded is independent of the required reliability level of the data.

10. The memory management method of claim 9, wherein the required reliability level is predetermined based on the type of the data, and then is recorded in an address mapping table, and
    wherein the generating of the ECC information comprises determining the required reliability level based on the address mapping table, and generating the ECC information.

11. A non-transitory computer readable recording medium storing a program to cause a computer to implement the method of claim 10.

12. The memory management method of claim 9, further comprising:
    reading the ECC code from the memory based on the ECC information, when the data is read from the memory; and
    computing a second ECC code for the read data based on the ECC information; and
    comparing the ECC code with the second ECC code based on the ECC information, detecting whether an error occurs in the read data, and correcting the error when the error is detected.

13. A non-transitory computer readable recording medium storing a program to cause a computer to implement the method of claim 12.

14. The memory management method of claim 9, wherein the computing of the ECC code comprises:
    when the data is metadata, computing a first ECC code for the metadata based on an entirety of the page where the metadata is to be recorded; and
    when the data is user data, computing a second ECC code for the user data for each sector of the page where the user data is to be recorded.

15. A non-transitory computer readable recording medium storing a program to cause a computer to implement the method of claim 14.

16. The memory management method of claim 14, wherein the recoding of the ECC code comprises recording the first ECC code on a predetermined sector of the page, and recording the second ECC code on a spare portion of the memory.

17. A non-transitory computer readable recording medium storing a program to cause a computer to implement the method of claim 16.

18. A non-transitory computer readable recording medium storing a program to cause a computer to implement the method of claim 9.

* * * * *